United States Patent [19]
Kojima et al.

[11] Patent Number: 6,075,834
[45] Date of Patent: Jun. 13, 2000

[54] FREQUENCY DIVIDER

[75] Inventors: Iwao Kojima, Kyoto; Yukio Hiraoka, Nishinomiya; Takayuki Shimazu, Kyoto, all of Japan

[73] Assignee: Matsushita Electric Industrial Co., Ltd., Osaka-fu, Japan

[21] Appl. No.: 09/026,231

[22] Filed: Feb. 19, 1998

[30] Foreign Application Priority Data

Feb. 21, 1997 [JP] Japan ................................ 9-037455

[51] Int. Cl.$^7$ ................................................ H03K 21/00
[52] U.S. Cl. ........................................... 377/47; 377/48
[58] Field of Search ......................................... 377/47, 48

[56] References Cited

U.S. PATENT DOCUMENTS 4,559,613  12/1985  Murphy et al. ............................ 377/48
4,609,881   9/1986  Wells ...................................... 331/1 A
5,070,310  12/1991  Hietala et al. ............................ 377/48

FOREIGN PATENT DOCUMENTS 56-037734  4/1981  Japan .

Primary Examiner—Margaret R. Wambach
Attorney, Agent, or Firm—Akin, Gump, Strauss, Hauer & Feld, L.L.P.

[57] ABSTRACT

In a frequency divider in which a dividing number defined by the ratio of an input frequency to an output frequency is changed between two states of M and M+1 (M is an integer), the time point when the dividing number becomes M+1 is randomized on the time axis with the average dividing number being maintained at M+1/N (N is an integer).

4 Claims, 9 Drawing Sheets

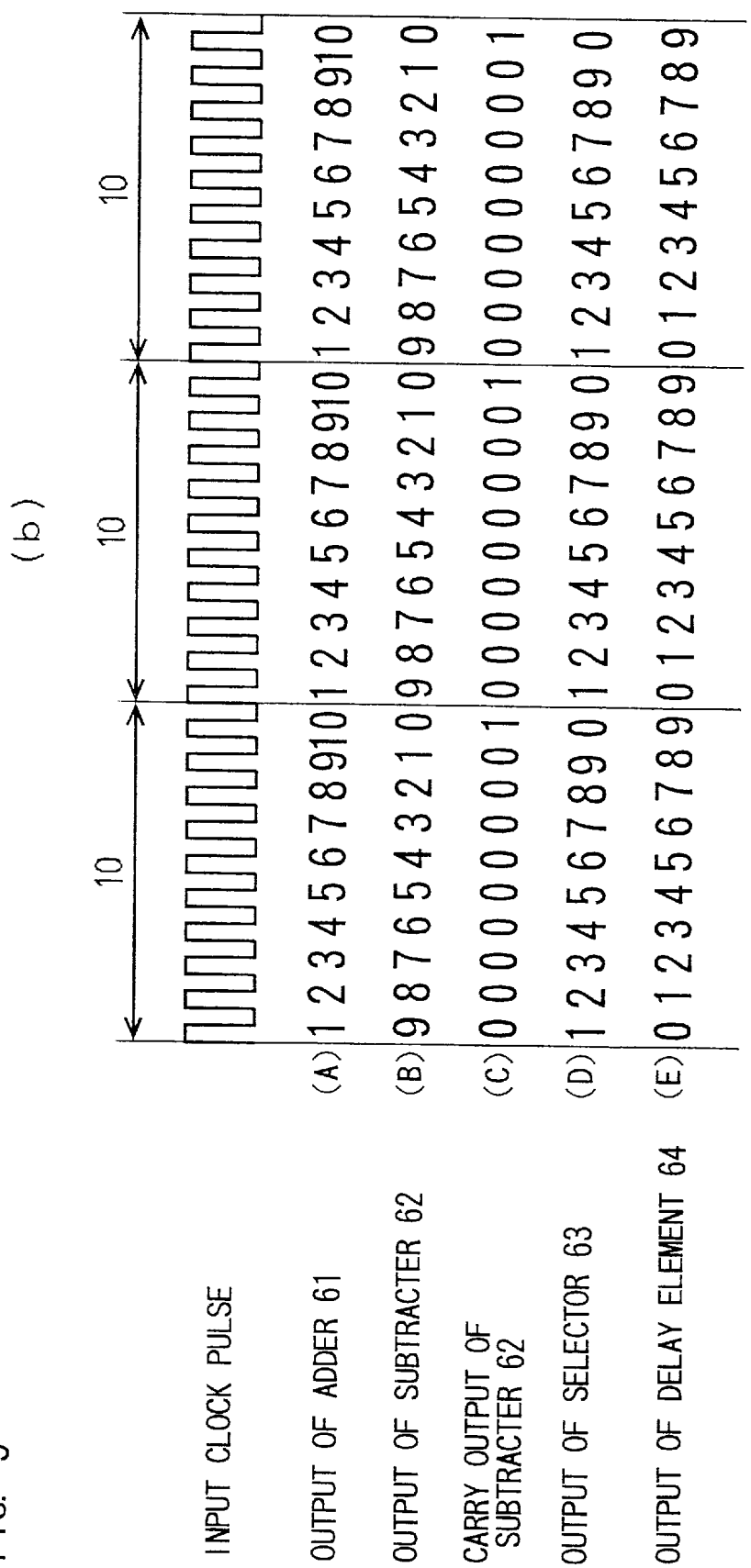

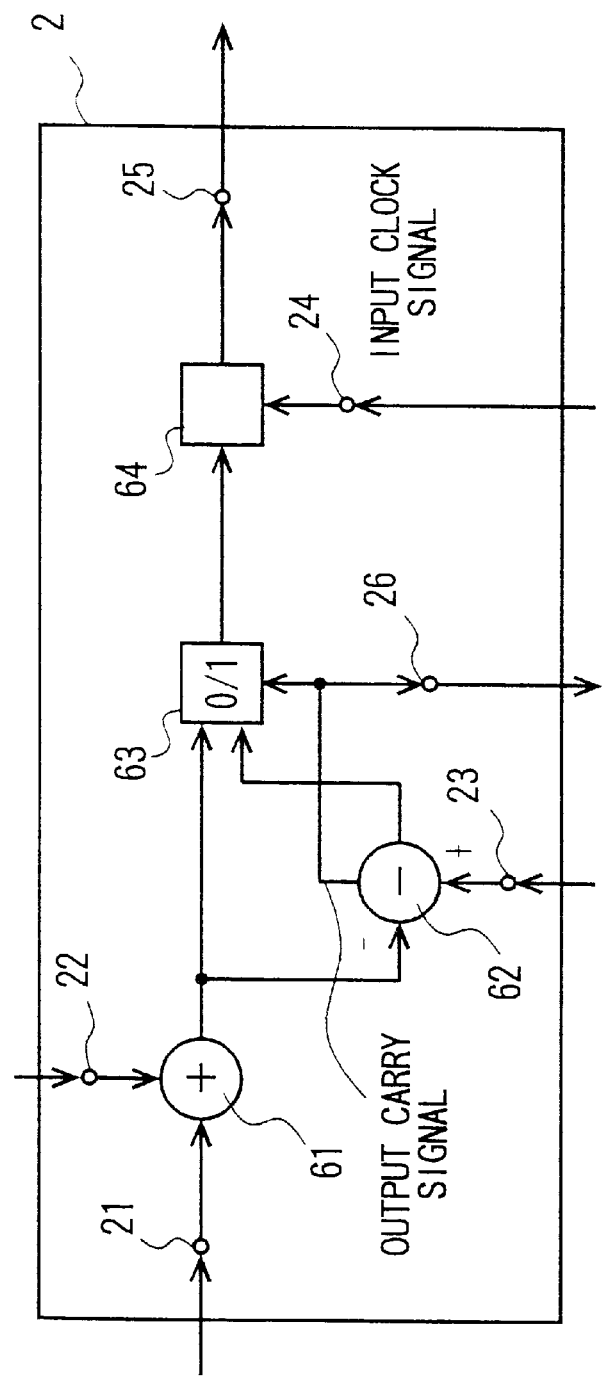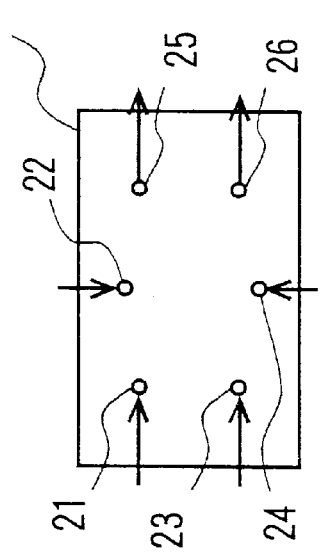
FIG. 6A
FIG. 6B

FREQUENCY DIVIDER

BACKGROUND OF THE INVENTION

The present invention relates to a frequency divider for use in a semiconductor integrated circuit.

The frequency divider is used, for example, in a part of a frequency divider of the type in which the ratio of an input frequency to an output frequency is a fractional value is hereinafter referred to as "fractional frequency divider". Such fractional frequency divider is extremely effective in that a lockup time can be reduced, because the reference signal frequency can be set to a high value compared with a phase-locked loop using a frequency divider of a type in which the above-mentioned division value is an integer.

The operation of a conventional fractional frequency divider will be described with reference to FIG. 8. In the factional frequency divider, a "dividing number" defined by the ratio of the input frequency to the output frequency has two programmable states of M and M+1 (M is a given integer). In the fractional frequency divider, the dividing number M or M+1 is controlled in each period as shown in the timing chart of FIG. 8. In the figure, a unit operation period T is divided into segments by an integer N. The segment that has the dividing number M+1 is controlled to occur once so as to occur at the same time in each unit operation period T. In FIG. 8, the time points in the unit operation period T are numbered 0, 1, . . . , N−2 and N−1. Here, the time point is a point of time in each period when the unit operation period T is divided into the number, N. The average dividing number M' in one unit operation period T is given by the following expression:

$$M'=\{(M+1)+(N-1)\times M\}/N=M+1/N.$$

The fractional frequency divider whose dividing number is a given fraction is thus realized.

In the above-described fractional frequency divider, as shown in the frequency spectrum distribution of the division output of FIG. 9, when an input signal with a frequency fo is frequency-divided by the average dividing number M', strong spurious spectrum components with a frequency fo/M'±fs (here, fs=1/T) are generated as well as signal components with the divided frequency fo/M' in the division output. This is because the fractional frequency divider repeats the same operation in the fixed operation period T.

BRIEF SUMMARY OF THE INVENTION

In view of the above-described problem, an object of the present invention is to provide a fractional frequency divider in which spurious spectrum output is reduced.

A fractional frequency divider of a first aspect of the present invention in which a dividing number defined by a ratio of an input frequency to an output frequency is changed between two states of M and M+1 (M is an integer) comprises means for controlling a time point when the dividing number becomes M+1, based on random numbers or sequential numbers similar to the random numbers.

The fractional frequency divider according to the present invention has a unit operation period divided by N (N is an integer).

According to the fractional frequency divider of the first aspect, since the time point when the dividing number changes are at random or substantially at random, the interval between the time points when the dividing number becomes random. For this reason, the frequency spectrum of spurious spectrum output included in the output signal of the fractional frequency divider is not fixed but is randomly diverses. As a result, strong spurious spectrum components are eliminated and spurious spectrum output is reduced.

A fractional frequency divider according to another aspect of the present invention, in which a dividing number has two states of M and M+1 and a unit operation period is divided by N, has means for controlling a time point when the dividing number becomes M+1 in an Lth (L is an integer) unit operation period, by obtaining the time point by the following expression:

$$\{a\times L\times(L-1)/2\} \bmod N$$

where a is a given integer and mod represents a remainder.

Since the time points when the dividing number is changed vary among unit operation periods according to the value of the above-described expression, the interval between the time points when the dividing number is changed is not fixed but is varied. For this reason, the frequency spectrum of spurious spectrum output included in the output signal of the fractional frequency divider is not fixed but randomly appears, so that spurious spectrum output is reduced.

A fractional frequency divider according to still another aspect of the present invention comprises a first accumulator, a second accumulator, a third accumulator and a fourth accumulator. The first accumulator comprises a first input terminal, a second input terminal, a third input terminal, a fourth input terminal, a first output terminal, and a second output terminal. An integer K is input to the first input terminal of the first accumulator, an integer N is input to the third input terminal, and a clock signal is input to the fourth input terminal. The second accumulator comprises a first input terminal, a second input terminal, a third input terminal, a fourth input terminal, a first output terminal, and a second output terminal. An output value of the first output terminal of the first accumulator is input to the second input terminal of the second accumulator. The integer N is input to the third input terminal of the second accumulator. A clock signal synchronous with respect to the clock input to the fourth input terminal of the first accumulator is input to the fourth input terminal of the second accumulator. The third accumulator comprises a first input terminal, a second input terminal, a third input terminal, a fourth input terminal, a first output terminal, and a second output terminal. The integer K is input to the first input terminal of the third accumulator. An output value of the first output terminal of the third accumulator is input to the second input terminal of the third accumulator. The integer N is input to the third input terminal of the third accumulator. The output value of the first output terminal of the third accumulator is output to the first input terminal of the second accumulator. The fourth accumulator comprises a first input terminal, a second input terminal, a third input terminal, a fourth input terminal, a first output terminal, and a second output terminal. An integer 1 is input to the first input terminal of the fourth accumulator, and an output value of the first output terminal of the fourth accumulator is input to the second input terminal of the fourth accumulator. The integer N is input to the third input terminal of the fourth accumulator, and a clock signal synchronous with respect to the clock input to the fourth input terminal of the first accumulator is input to the fourth input terminal of the fourth accumulator. An output value of the second output terminal of the fourth accumulator is output to the fourth input terminal of the third accumulator.

This fractional frequency divider further comprises a first delay element, a first selector, and a programmable frequency divider. The first delay element stores the value output from the second output terminal of the fourth output accumulator, and provides a value stored therein when enabled by a clock signal synchronous with respect to the clock input to the fourth input terminal of the first accumulator. The first selector to which the output value of the first output terminal of the first accumulator and an output value of the first output terminal of the second accumulator are input outputs either one of the outputs to the second input terminal of the first accumulator by being controlled by an output of the first delay element. In the programmable frequency divider, the dividing number has two programmable states of M and M+1, and the two dividing number states of M and M+1 are controlled by a value output from the second output terminal of the first accumulator. The first accumulator, the second accumulator, the third accumulator and the fourth accumulator each comprise an adder for adding values input to the first and second input terminals, and a subtracter for subtracting an output value of the adder from a value input to the third input terminal, and outputting a carry output to the second output terminal. The first to fourth accumulators further comprise a selector to which an output value of the adder and an output value of the subtracter are input, and for outputting either one of the outputs by being controlled by the carry output of the subtracter, and a delay element for storing a value input from the selector, and outputting the stored value to the first output terminal by being controlled by a clock input to the fourth input terminal.

According to the above-described configuration, since the interval between the time points when the dividing number is changed is varied, the interval between the time points when the dividing number is changed is not fixed but is varied. For this reason, the frequency spectrum of spurious spectrum output included in the output signal of the fractional frequency divider is decentralized, so that spurious spectrum output is reduced.

BRIEF DESCRIPTION OF THE SEVERAL VIEWS OF THE DRAWING

FIG. 5 is a timing chart showing the operation of a first accumulator in FIG. 6;

FIG. 6A is a block diagram showing the configuration of the first accumulator of the fractional frequency divider of FIG. 4;

FIG. 6B is a view showing the positions of terminals of the first accumulator;

DETAILED DESCRIPTION OF THE INVENTION

Fractional frequency dividers of the present invention will be described with reference to FIG. 1 to FIG. 7.

Figure 4:
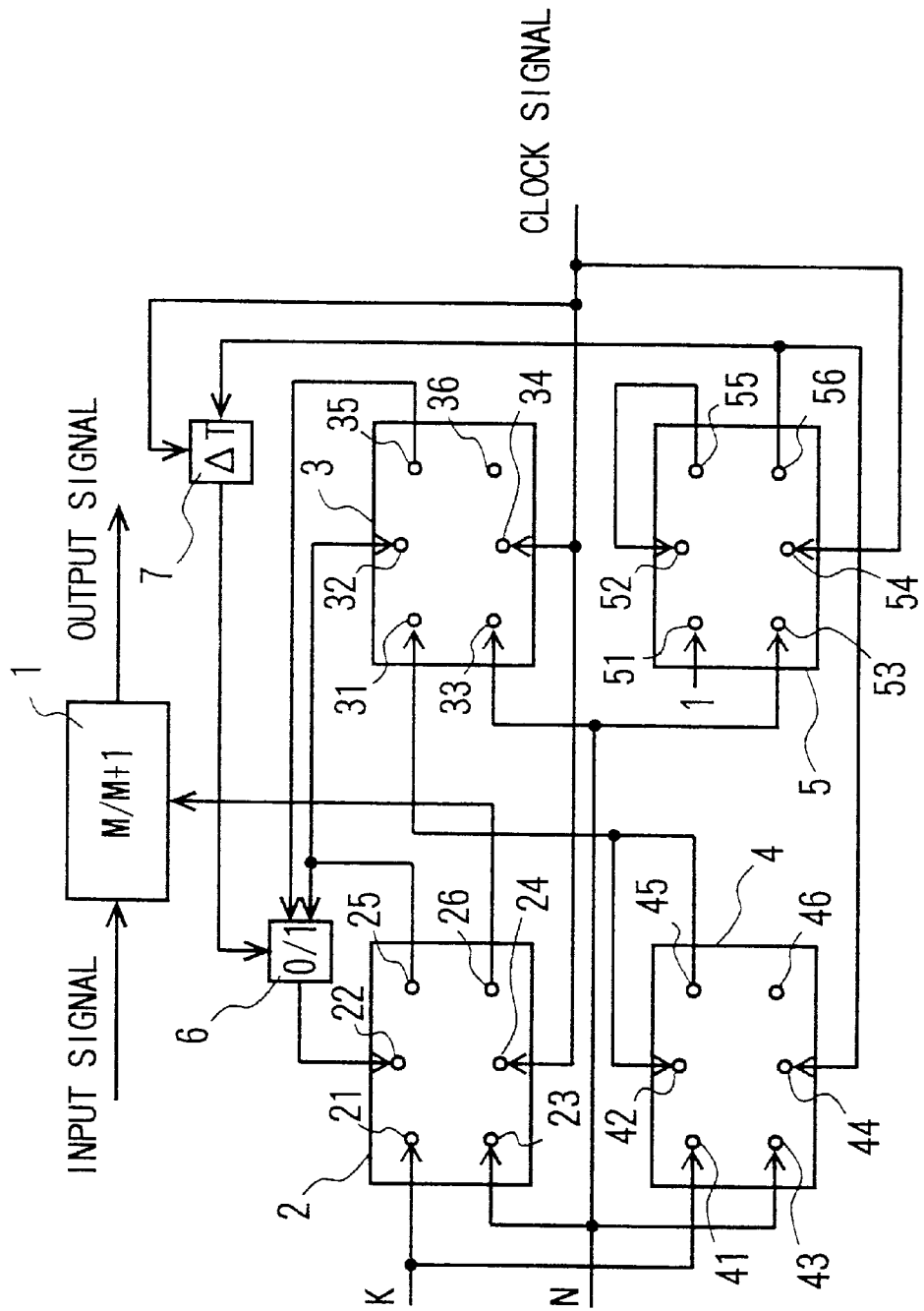
FIG. 4 is a block diagram showing the configuration of a fractional frequency divider according to another embodiment of the present invention.

A circuit configuration of the fractional frequency divider of the present invention is shown in the block diagram of FIG. 4. The configuration and operation of the circuit will be described in detail in a third embodiment. In first and second embodiments, the basic operation principle of the present invention will be described.

[First Embodiment]

Figure 1:
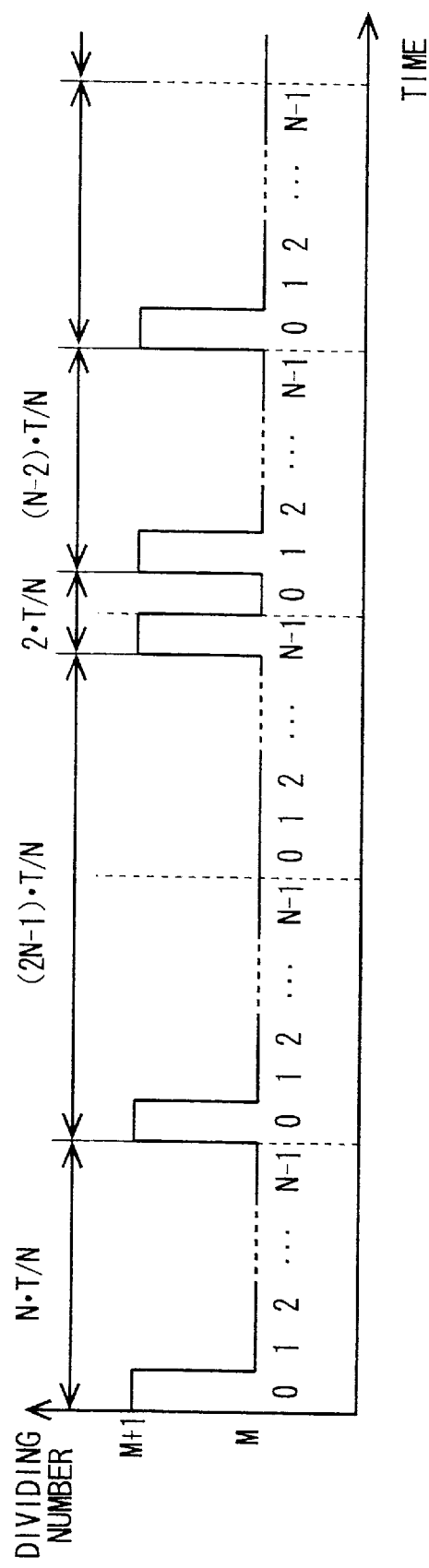
FIG. 1 is a timing chart showing the operation of a fractional frequency divider of the present invention.
Figure 2:
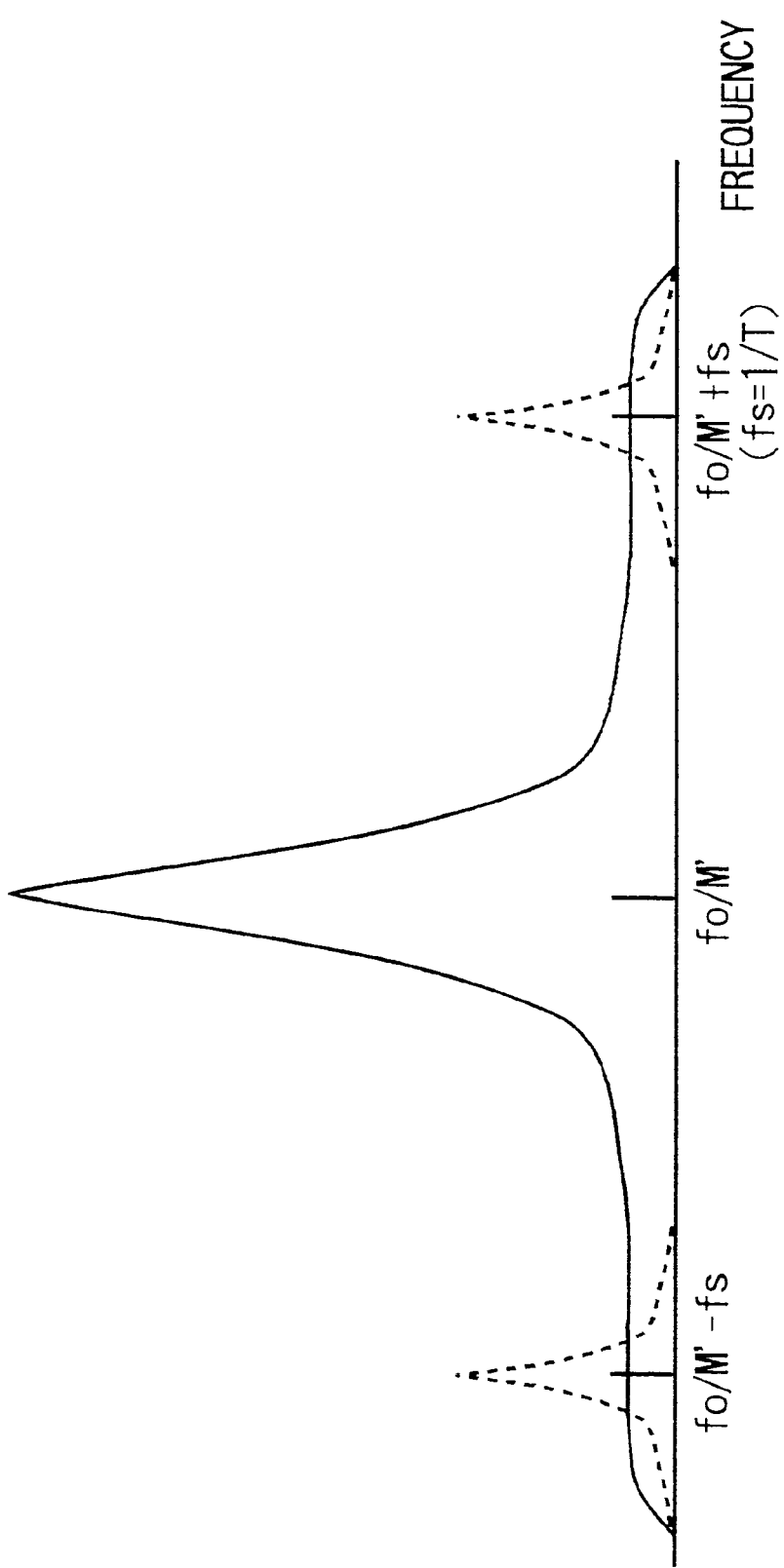
FIG. 2 is a view showing the output signal spectrum of the fractional frequency divider of the present invention.

The fractional frequency divider according to the first embodiment of the present invention will be described with reference to FIG. 1 and FIG. 2.

The fractional frequency divider of the first embodiment is configured so that the dividing number is changed between two states of M and M+1. The timing when the dividing number becomes M or M+1 is controlled as shown in the timing chart of FIG. 1, so that the frequency divider operates as a fractional frequency divider. In the timing chart of FIG. 1, the unit operation period T is divided by N. In the unit operation period T, the time point when the dividing number becomes M+1 is randomized on the time axis, and the dividing number becomes M+1 only once in each unit operation period T. In FIG. 1, the time points in the unit operation period T are numbered 0, 1, . . . , N−2 and N−1.

The timing chart of FIG. 1 will be described in detail. For example, the interval between the time points when the dividing number is changed is varied like T, (2N−1)·T/N, 2·T/N, (N−2)·T/N, . . . with an average dividing number M' being maintained at M+1/N. Consequently, the interval between the time points when the dividing number becomes M+1 is randomized. As a result, spurious spectrum output included in the output signal of the fractional frequency divider is decentralized to a wide frequency band as shown in FIG. 2 and is not centralized at a frequency fo/M'±fs like in the prior art. Spurious spectrum output is reduced as a whole because it is decentralized to the wide peripheral frequency band. It is an ideal to control the time points when the dividing number is changed so as to be randomized. However, the time points may be controlled by use of sequential numbers similar to random numbers such as the well-known M series.

[Second Embodiment]

Figure 3:
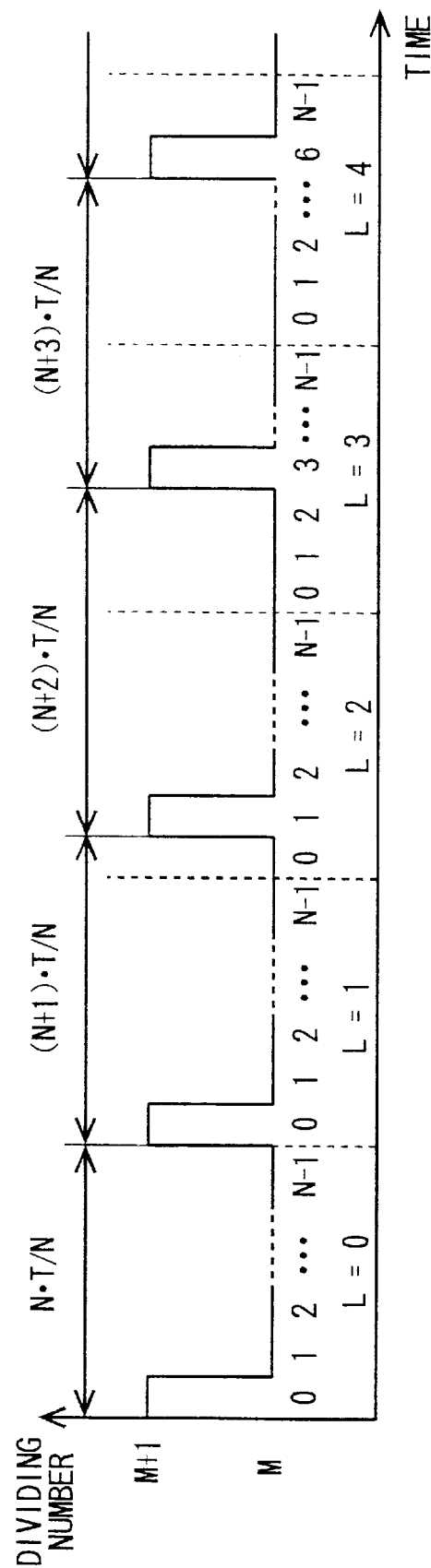
FIG. 3 is a timing chart showing the operation of another fractional frequency divider of the present invention.

The fractional frequency divider according to the second embodiment of the present invention will be described with reference to FIG. 3.

The fractional frequency divider of the second embodiment is configured so that the dividing number is changed between the two states of M and M+1. As shown in the timing chart of FIG. 3, the unit operation period T is divided by N. The fractional frequency divider is controlled so that the number of the time point when the dividing number becomes M+1 in the Lth (L is an integer) unit operation period T coincides with the value obtained by the following expression:

$$\{a \times L \times (L-1)/2\} \bmod N,$$

Where, "mod" represents the remainder. In the above-described example, a=1. The time points in one unit operation period T are numbered 0, 1, . . . , N−2 and N−1.

By doing so, the interval between the time points when the dividing number is changed is varied like N·T/N, (N+1)·T/N, (N+2)·T/N, (N+3)·T/N, . . . , (2·N−1)·T/N, N·T/N, (N+1)·T/N, . . . with the average dividing number M' being maintained at M+1/N. Thus, the interval is not fixed to the period T but is varied. As a result, similarly to the first embodiment, spurious spectrum output included in the output signal of the fractional frequency divider is reduced because it is not centralized at a specific frequency fo/M'±fs like in the conventional fractional frequency divider but is decentralized to a wide frequency band.

[Third Embodiment]

The fractional frequency divider according to the third embodiment of the present invention will be described with reference to FIG. 4 to FIG. 7.

FIG. 4 is a block diagram showing the configuration of the fractional frequency divider according to the third embodiment. The fractional frequency divider comprises a programmable frequency divider 1, a first accumulator 2, a second accumulator 3, a third accumulator 4, a fourth accumulator 5, a selector 6, and a delay element 7.

First, the internal configuration and operation of the first accumulator 2 will be described with reference to FIG. 5 and FIG. 6A. In FIG. 6A, the first accumulator 2 comprises four input terminals of a first input terminal 21, a second input terminal 22, a third input terminal 23 and a fourth input terminal 24, and two output terminals of a first output terminal 25 and a second output terminal 26. The first accumulator 2 further comprises an adder 61, a subtracter 62, a selector 63, and a delay element 64. FIG. 6B is a view showing the positions of the terminals of the first accumulator 2 of FIG. 6A, which is the same as the one shown in FIG. 4. In the description given below, term "value" will represent numeral data. Each element operates synchronously with respect to the input of a clock pulse. FIG. 5 is a timing chart showing the operation of a case in which N=10 and M=1.

The adder 61 adds the values input to the first input terminal 21 and the second input terminal 22. The subtracter 62 subtracts the output value of the adder 61 from the value input to the third input terminal 23, and outputs a carry signal output representing the change of digit to the second output terminal 26. The subtracter 62 outputs a value 1 as the carry output only when the subtraction result is 0, and otherwise outputs a value 0. The selector 63 is controlled by the carry output of the subtracter 62, and outputs either the addition value input from the adder 61 or the subtraction value input from the subtracter 62. The selector 63 outputs the addition value input from the adder 61 when the carry output of the subtracter 62 is a value 0, and outputs the subtraction value input from the subtracter 62 when the carry output of the subtracter 62 is a value 1. The delay element 64 stores the output value of the selector 63, and outputs to the first output terminal 25 the value stored every time a pulse is input by being controlled by a clock input to the fourth input terminal 24.

An example of the basic operation of the first accumulator 2 configured as described above will be described with reference to FIG. 5 and FIG. 6A. FIG. 5 shows a case in which an integer 1 is input to the first input terminal 21, an integer 10 is input to the third input terminal 23, a clock signal is input to the fourth input terminal 24, and the first output terminal 25 and the second input terminal 22 are connected to each other. When a set value 1 is input to the first input terminal 21 and the values 0, . . . , 9 shown in the row E of FIG. 5 output from the delay element 64 are input to the second input terminal 22, the output of the adder 61 is the values 1, . . . , 10 shown in the row A. The values 1, . . . , 10 in the row A and the input value 10 from the third input terminal 23 are input to the subtracter 62. Consequently, the values 9, . . . , 0 in the row B of FIG. 5 and the carry output 0, . . . , 1 in the row C are output from the subtracter 62. The values in the row A and the row B are input to the selector 63. Since the carry output is the values 0, . . . , 1 in the row C, the values 1, . . . 0 in the row D are output from the selector 63. The values 1, . . . , 0 shown in row D of FIG. 5 are successively input to the delay element 64, and after a delay of one clock, the values 0, . . . , 9 shown in the row E are output from the delay element 64. Thus, an output value 1 is output from the second output terminal 26 every time ten clock pulses are input to the fourth input terminal 24.

The internal configurations and operations of the second accumulator 3, the third accumulator 4 and the fourth accumulator 5 are the same as those of the first accumulator 2, and no overlapping description will be given because the same descriptions are applicable.

If this fractional frequency divider is controlled such that the dividing number becomes M+1 when the output value from the second output terminal 26 is 1, it corresponds to the conventional fractional frequency divider having two states of M and M+1 whose average dividing number M' is M+1/N Hereinafter, the fractional frequency divider of FIG. 4 will be described. Here, one period is a time in which a number, N, of clocks are input.

In the first accumulator 2, an integral value K is input to the first input terminal 21, the output value of the selector 6 is input to the second input terminal 22, an integral value N is input to the third input terminal 23, and a clock is input to the fourth input terminal 24. The programmable frequency divider 1 is controlled by the output value of the second output terminal 26. In the second accumulator 3, a first input terminal 31 is connected to a first output terminal 45 of the third accumulator 4, and a second input terminal 32 is connected to the first output terminal 25 of the first accumulator 2. The integral value N is input to a third input terminal 33 of the second accumulator 3, and a clock is input to a fourth input terminal 34. In the third accumulator 4, the integral value K is input to a first input terminal 41, the output value of the first output terminal 45 is input to a second input terminal 42, the integral value N is input to a third input terminal 43, and the output value of a second output terminal 56 of the fourth accumulator 5 is input to the fourth input terminal 44. In the fourth accumulator 5, an integral value 1 is input to a first input terminal 51, the output value of a first output terminal 55 is input to a second input terminal 52, the integral value N is input to a third input terminal 53, and a clock is input to a fourth input terminal 54. A value 1 is output from the second output terminal 56 of the fourth accumulator 5 at every period T to thereby control the third accumulator 4. The delay element 7 stores the value output from the second output terminal 56 of the fourth accumulator 5, and outputs the contents of storage by being controlled by a clock. The selector 6 is controlled by the output of the delay element 7, and outputs either the value input from the first output terminal 25 of the first accumulator 2 or the value input from a first output terminal 35 of the second accumulator 3. When the output value of the delay element 7 is 0, the selector 6 outputs the value input from the first output terminal 25 of the first accumulator 2 to the selector 6 as it is. When the output value of the delay element 7 is 1, the selector 6 outputs the value input from the first output terminal 35 of the second accumulator 3 to the selector 6 as it is. In the programmable frequency divider 1 whose dividing number has two states of M and M+1, the dividing number is changed between the two states of M and M+1 by being controlled by the value output from the second output terminal 26 of the first accumulator 2. The dividing number becomes M+1 when the output value from the second output terminal 26 of the first accumulator 2 is 1.

Figure 7:
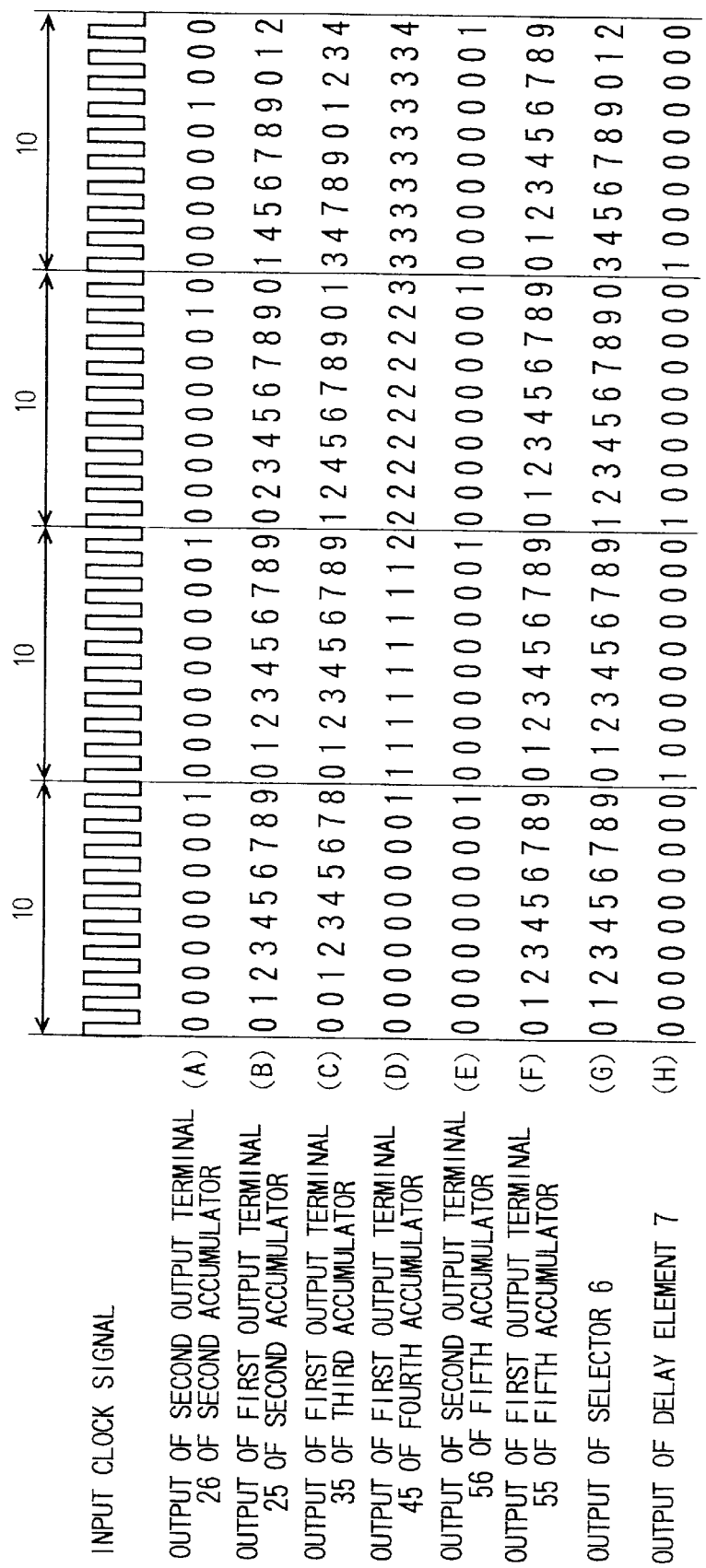
FIG. 7 is a timing chart showing the operation of the fractional frequency divider of FIG. 4.
Figure 8:
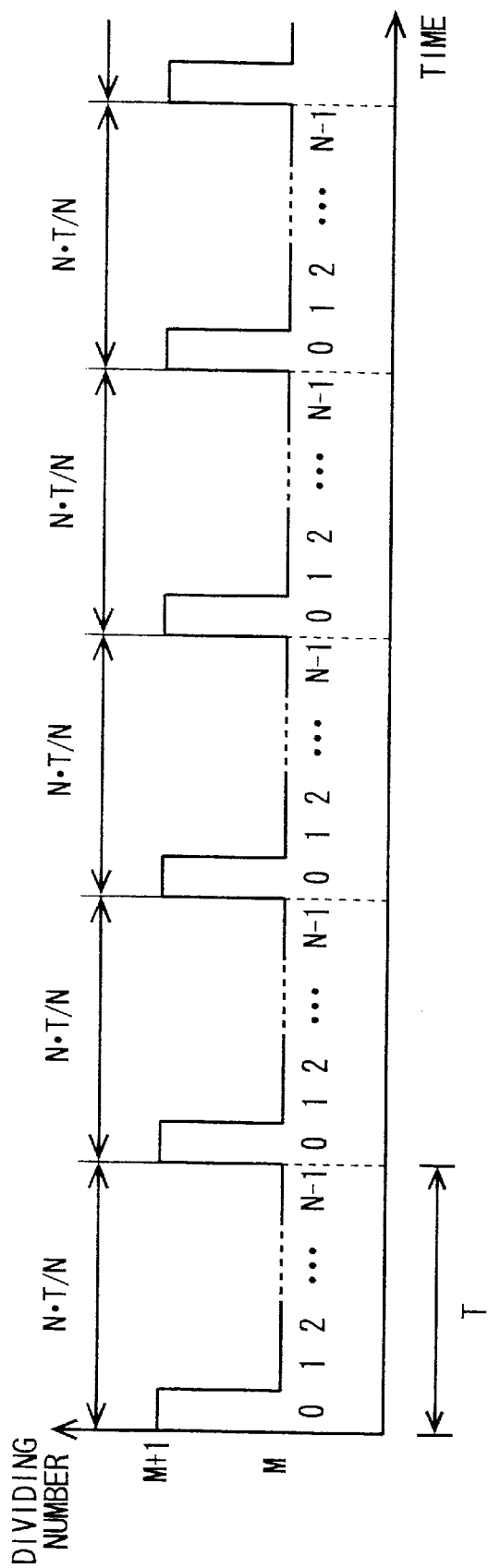
FIG. 8 is the timing chart showing the operation of the conventional fractional frequency divider.
Figure 9:
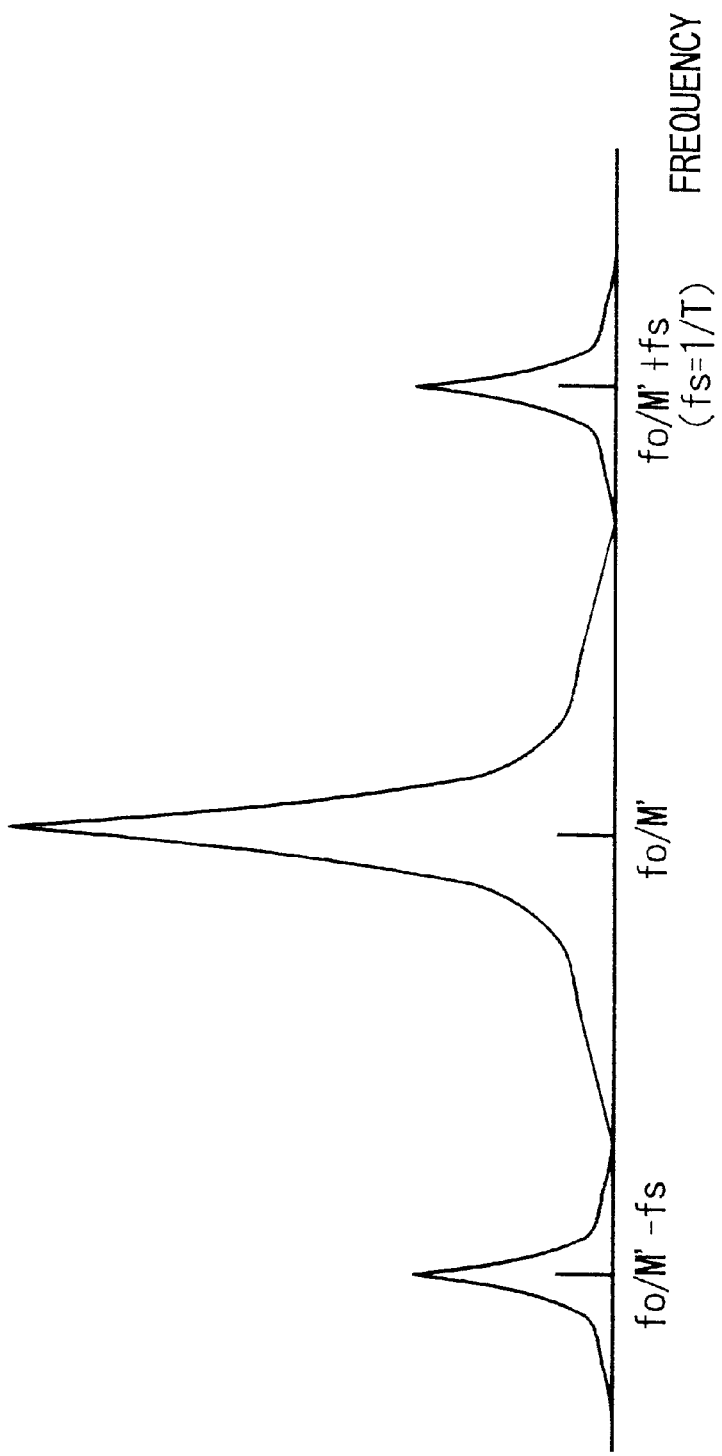
FIG. 9 is the view showing the output signal spectrum of the conventional fractional frequency divider.

An example of the operation of the fractional frequency divider configured as described above will be described with reference to the timing chart of FIG. 7. In this example, K=1 and N=0 Values 1, . . . , 1 are input to the first input terminal 21 of the first accumulator 2 in response to ten clock pulses. The values 0, ..., 9 shown in the row G of FIG. 7 are input to the second input terminal 22, and values 10, ..., 10 are input to the third input terminal 23. Consequently, the values 0, ..., 9 shown in the row B are output from the first output terminal 25 of the first accumulator 2, and the values 0, ..., 1 shown in the row A are output from the second output terminal 26. The values 0, 0, ... 3, 3, 4 shown in the row D are input to the first input terminal 31 of the second accumulator 3, the values 0, 1, 2, ... 0, 1, 2 shown in the row B are input to the second input terminal 32, and the values 10, ..., 10 are input to the third input terminal 33. The values 0, 0, 1, ... 2, 3, 4 in the row C are output to the first output terminal 35. Since the values in the row E are input as clock pulses to the fourth input terminal 44 of the third accumulator 4, the values 0, 0, ... 3, 3, 4 in the row D are output to the first output terminal 45. Since the inputs of the fourth accumulator 5 are the same as those of the first accumulator 2, the output value of the first output terminal 55 is as shown in the row F of FIG. 7, and the output value of the second output terminal 56 is as shown in the row E. The output of the selector 6 is shown in the row G. The output of the delay element 7 is shown in the row H.

The programmable frequency divider 1 is controlled based on the output values shown on the row A in FIG. 7, and, the interval between the time points when the dividing number becomes M+1 is varied like 10·T/10, 9·T/10, 8·T/10, ..., 1·T/10, 10·T/10, ... (not shown). Thus, the interval is not fixed to the period T but is varied. Consequently, similarly to the first and second embodiments, spurious spectrum output included in the output signal of the fractional frequency divider is reduced because it is not centralized at the specific frequency fo/M'±fs like in the conventional fractional frequency divider but is decentralized to a wide frequency band.

In the above-described operation example, the value K=1. However, the value K may be any integer that satisfies K≦N. In this case, spurious spectrum components included in the output signal of the fractional frequency divider is reduced like in the example in which K=1, because spurious spectrum output is not centralized at the specific frequency fo/M'±fs like in the conventional fractional frequency divider but is decentralized to a wide frequency band.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A frequency divider of which a dividing number defined by a ratio of an input frequency to an output frequency in one period is given by an integer value M or another integer value different from said integer value M, wherein successive N periods over the passage of time are designated as one unit operation period, in an integer L-th one unit operation period, from a one unit operation period in the period that the one unit operation periods are successive over the passage of time, the period of the dividing number which is different from said integer M is arranged in an order according to a remainder value, with respect to said integer N, of a value proportional to the product of said integer L and an integer value in the vicinity of said integer L.

2. A frequency divider in accordance with claim 1, wherein the integer value different from said integer M is given by an integer value in the vicinity of said integer M.

3. A frequency divider of which a dividing number defined by a ratio of an input frequency to an output frequency in one period is given by an integer value M or an integer value which is added to said integer value M by one, wherein successive N periods over the passage of time are designated as one unit operation period, in an integer L-th one unit operation period from a one unit operation period of the period in which the one unit operation periods are successive over the passage of time, the period of the dividing number different from said integer value M is arranged in order according to the value given by $\{a \times L \times (L-1)/2\} \bmod N,$ where, a is an arbitrary integer value and mod represents remainder calculation process.

4. A frequency divider comprising an input terminal, an output terminal and external signal input terminal, wherein successive N periods in the passage of time are designated as one unit operation period, in each one unit operation period in successive periods in which the one unit operation periods are successive in the passage of time, the dividing number defined by the ratio of the frequency of the signal given to said input terminal to the frequency of the signal output from said output terminal corresponding to a signal given to said external signal input terminal is given by a predetermined integer M or an integer of which one is added to said integer value M, the period of the dividing number of a value of which one is added to said integer M in an integer L-th one unit operation period from a predetermined one unit operation period is arranged in the order according to the value given by $\{a \times L \times (L-1)/2\} \bmod N,$ where, a is an arbitrary integer, mod represents remainder calculation process, a programmable divider comprising an input terminal, an output terminal and an external signal input terminal, of which a dividing number, which is defined as the ratio of the frequency of the signal applied to said input terminal to the frequency of a signal output from said output terminal according to a signal given to said external signal input terminal, is given by a value of a predetermined integer M or a value of which one is added to the integer M, a first accumulator comprising a first, a second, a third and a fourth input terminals to which signals are input and a first and a second output terminals from which signals are output, an adder to which signals which are applied to said first and second input terminals respectively, are added and output to the output terminal, a subtractor to which both the signal applied to said third input terminal and the signal at the output terminal of said adder are inputted, and a subtracted signal of which one is subtracted from another of said two signals is output from the output terminal, and a carry signal representing the change of a digit by the subtraction is output from another output terminal to give to said second output terminal, a first selector to which the signal of the output terminal of said adder, said subtraction signal and said carry signal are inputted respectively, and from which either signal of the output terminal of said adder or said subtraction signal is output by selecting according to the value of said carry signal, and a delay element to which a signal of the output terminal of said first selector is inputted and a delayed signal is given to said first output terminal in synchronism with a signal given to said fourth input terminal, a second accumulator, a third accumulator, a fourth accumulator having the same configuration as said first accumulator, a second selector comprising a pair of input terminals, an output terminal and an external signal input terminal, and one of signals given to said pair of input terminals is selected in accordance with the signal given to said external signal input terminal and is output to the output terminal, and a first delay element comprising an input terminal, an output terminal and an external signal input terminal, and the signal being delayed from a signal given to said input terminal is output to said output terminal in synchronism with the signal given to said external signal input terminal, whereby an integer K is given to said first input terminals of said first and third accumulators, the integer 1 is given to said first input terminal of said fourth accumulator, an integer N is given to said third input terminals of said first to fourth accumulators.

a clock signal is given to said fourth input terminals of said first, second and fourth accumulators and the external signal input terminal of said first delay element, the signal of the first output terminal of said fourth accumulator is given to the second input terminal of the fourth accumulator, the signal of the second output terminal of the fourth accumulator is given to the fourth input terminal of said third accumulator and the input terminal of said first delay element, the signal of the first output terminal of said third accumulator is given to the second input terminal of the third accumulator and the first input terminal of said second accumulator, the signals of said first output terminals of said first and second accumulators are given to said pair of input terminals of said second selector, respectively, the signal of the output terminal of said first delay element is given to the external signal input terminal of said second selector, the signal of the output terminal of the second selector is given to said second input terminal of said first accumulator, the signal of said first output terminal of said first accumulator is given to said second input terminal of said second accumulator, and the signal of the second output terminal of the first accumulator is given to said external signal input terminal of said programmable divider.

* * * * *